(12) United States Patent
Zhang et al.

(10) Patent No.: US 12,224,283 B2
(45) Date of Patent: *Feb. 11, 2025

(54) SEMICONDUCTOR MEMORY DEVICE

(71) Applicant: Fujian Jinhua Integrated Circuit Co., Ltd., Quanzhou (CN)

(72) Inventors: Janbo Zhang, Quanzhou (CN); Yu-Cheng Tung, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/239,720

(22) Filed: Aug. 29, 2023

(65) Prior Publication Data

US 2023/0411387 A1 Dec. 21, 2023

Related U.S. Application Data

(63) Continuation of application No. 17/516,713, filed on Nov. 2, 2021, now Pat. No. 11,784,184.

(30) Foreign Application Priority Data

Jul. 23, 2021 (CN) .......................... 202110837426.2
Jul. 23, 2021 (CN) .......................... 202121695927.3

(51) Int. Cl.
 *H01L 27/088* (2006.01)
 *H01L 29/06* (2006.01)
 *H01L 29/78* (2006.01)

(52) U.S. Cl.
 CPC ........ *H01L 27/088* (2013.01); *H01L 29/0649* (2013.01); *H01L 29/7813* (2013.01)

(58) Field of Classification Search
 CPC ............... H01L 27/088; H01L 29/0649; H01L 29/7813; H10B 12/09; H10B 12/34; H10B 12/488
 See application file for complete search history.

(56) References Cited

U.S. PATENT DOCUMENTS

| | | | |
|---|---|---|---|
| 11,784,184 B2 * | 10/2023 | Zhang | H01L 27/088 257/330 |
| 2016/0233297 A1 | 8/2016 | Tomoyama | |
| 2017/0125423 A1 * | 5/2017 | Lin | H10B 12/315 |

OTHER PUBLICATIONS

Tung, the specification, including the claims, and drawings in the U.S. Appl. No. 17/396,774, filed Aug. 9, 2021.
(Continued)

*Primary Examiner* — Cuong B Nguyen
(74) *Attorney, Agent, or Firm* — Winston Hsu (57) ABSTRACT

A semiconductor memory device includes a substrate, an active structure, a shallow trench isolation and a plurality of word lines. The active structure is disposed in the substrate, and includes a plurality of first active fragments and a plurality of second active fragments extended parallel to each other along a first direction and the second active fragments are disposed outside a periphery of all of the first active fragments. The shallow trench isolation is disposed in the substrate to surround the active structure, and which includes a plurality of first portions and a plurality of second portions. The word lines are disposed in the substrate, parallel with each other to extend along a second direction, wherein at least one of the word lines are only intersected with the second active fragments, or at least one of the word lines does not pass through any one of the second portions.

20 Claims, 4 Drawing Sheets

(56) References Cited

OTHER PUBLICATIONS

Zhang, the specification, including the claims, and drawings in the U.S. Appl. No. 17/336,275, filed Jun. 1, 2021.
Yan, the specification, including the claims, and drawings in the U.S. Appl. No. 17/387,992, filed Jul. 28, 2021.
Zhang, the specification, including the claims, and drawings in the U.S. Appl. No. 17/396,775, filed Aug. 9, 2021.

* cited by examiner

SEMICONDUCTOR MEMORY DEVICE

CROSS REFERENCE TO RELATED APPLICATIONS

This application is a continuation application of U.S. application Ser. No. 17/516,713, filed on Nov. 2, 2021. The content of the application is incorporated herein by reference.

BACKGROUND OF THE INVENTION

1. Field of the Invention

The present disclosure generally relates to a semiconductor memory device, and more particularly, to a semiconductor memory device having active areas and shallow trench isolations.

2. Description of the Prior Art

With the miniaturization of semiconductor devices and the complexity of integrated circuits, the size of elements is continuously shrinking and the structure is constantly changing. Therefore, maintaining the performance of small-sized semiconductor elements is the standard purpose of the present industry. In the semiconductor fabricating process, most of the active areas are defined on the substrate as a bass element, and then, the required elements are further formed on the active areas. Generally, the active areas are plural patterns formed within the substrate through the photolithography and etching processes. However, due to the sized-shrinking requirements, the width of the active areas has been gradually reduced, and the pitch between the active areas has also been gradually reduced thereby, so that the fabricating process of active areas encounters plenty limitations and challenges that fails to meet the practical product requirements.

SUMMARY OF THE INVENTION

One of the objectives of the present disclosure provides a semiconductor memory device, in which the word lines disposed at the outer side are used as dummy word lines to protect the word lines disposed at the inner side, thereby from the word lines disposed at the inner side from directly connection with the bit lines formed subsequently through the active structure. With these arrangements, the semiconductor memory device of the present disclosure may achieve better device performance.

To achieve the purpose described above, one embodiment of the present disclosure provides a semiconductor memory device including a substrate, an active structure, a shallow trench isolation and a plurality of word lines. The active structure is disposed in the substrate, and includes a plurality of first active fragments and a plurality of second active fragments, wherein each of the first active fragments and each of the second active fragments are extended parallel to each other along a first direction and the second active fragments is disposed outside a periphery of all of the first active fragments. The first active fragments have a same first length in the first direction, the second active fragments have a second length and a third length different from the first length. The shallow trench isolation is disposed in the substrate to surround the active structure. The word lines are disposed in the substrate, parallel with each other to extend along a second direction, wherein at least one of the word lines are only intersected with the second active fragments, and the second direction is not perpendicular to the first direction.

To achieve the purpose described above, one embodiment of the present disclosure provides a semiconductor memory device including a substrate, an active structure, a shallow trench isolation and a plurality of word lines. The active structure is disposed in the substrate, and includes a plurality of first active fragments and a plurality of second active fragments, wherein each of the first active fragments and each of the second active fragments are extended parallel to each other along a first direction and the second active fragments is disposed outside a periphery of all of the first active fragments. The first active fragments have a same first length in the first direction, the second active fragments have a second length and a third length different from the first length in the first direction respectively, wherein the first active fragments and the second active fragments have first gaps therebetween in a second direction being not perpendicular to the first direction, and the first active fragments and the second active fragments have second gaps therebetween in the first direction, and the second gap is greater than the first gap. The shallow trench isolation is disposed in the substrate to surround the active structure, wherein the shallow trench isolation includes a plurality of first portions and a plurality of second portions filled in the first gaps and the second gaps respectively. The word lines are disposed in the substrate, parallel with each other to extend along the second direction, wherein at least one of the word lines does not pass through any one of the second portions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 are schematic diagrams illustrating a semiconductor memory device according to a first preferable embodiment in the present disclosure, wherein:

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
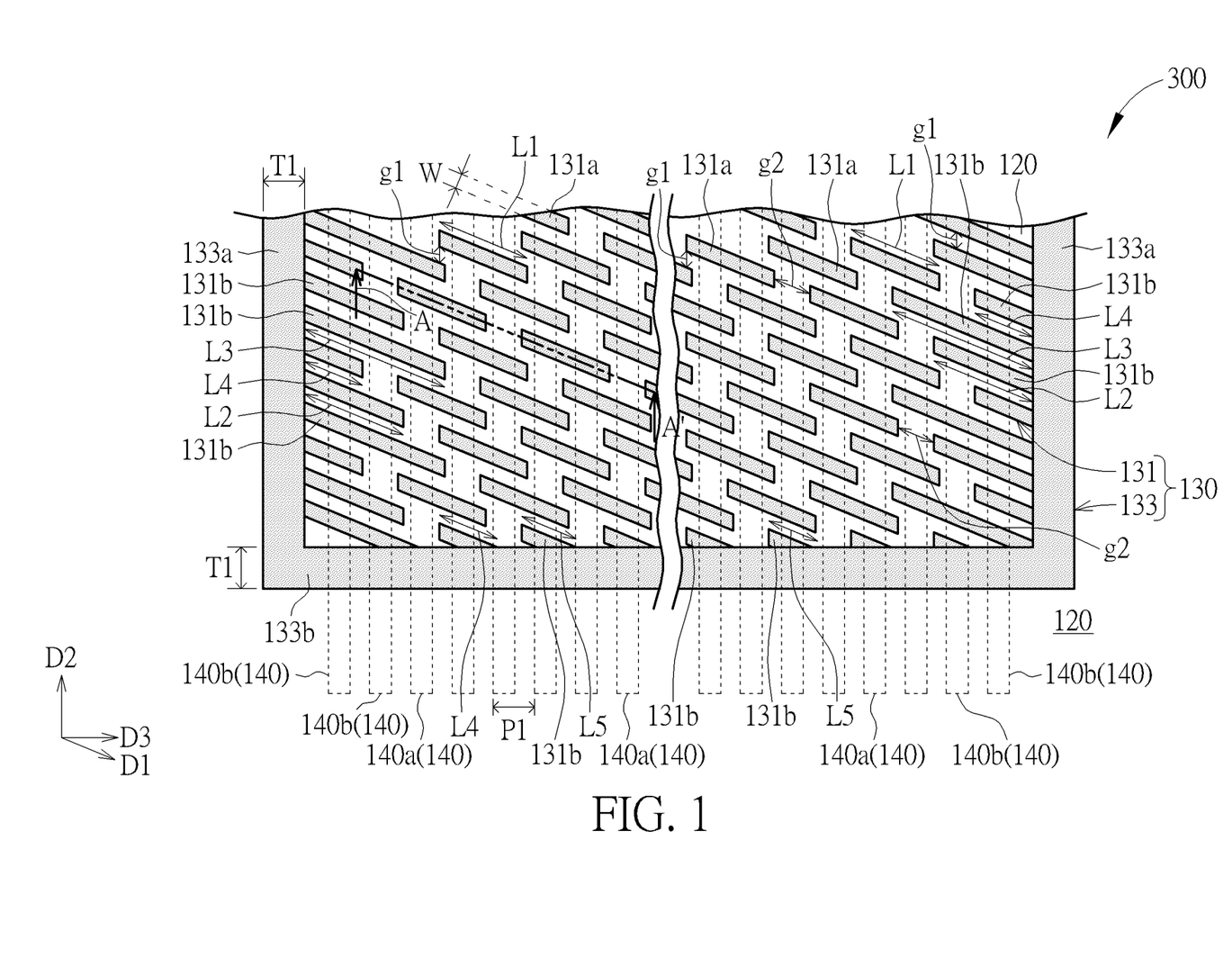
FIG. 1 is a schematic top view of a semiconductor memory device in the present disclosure.
Figure 2:
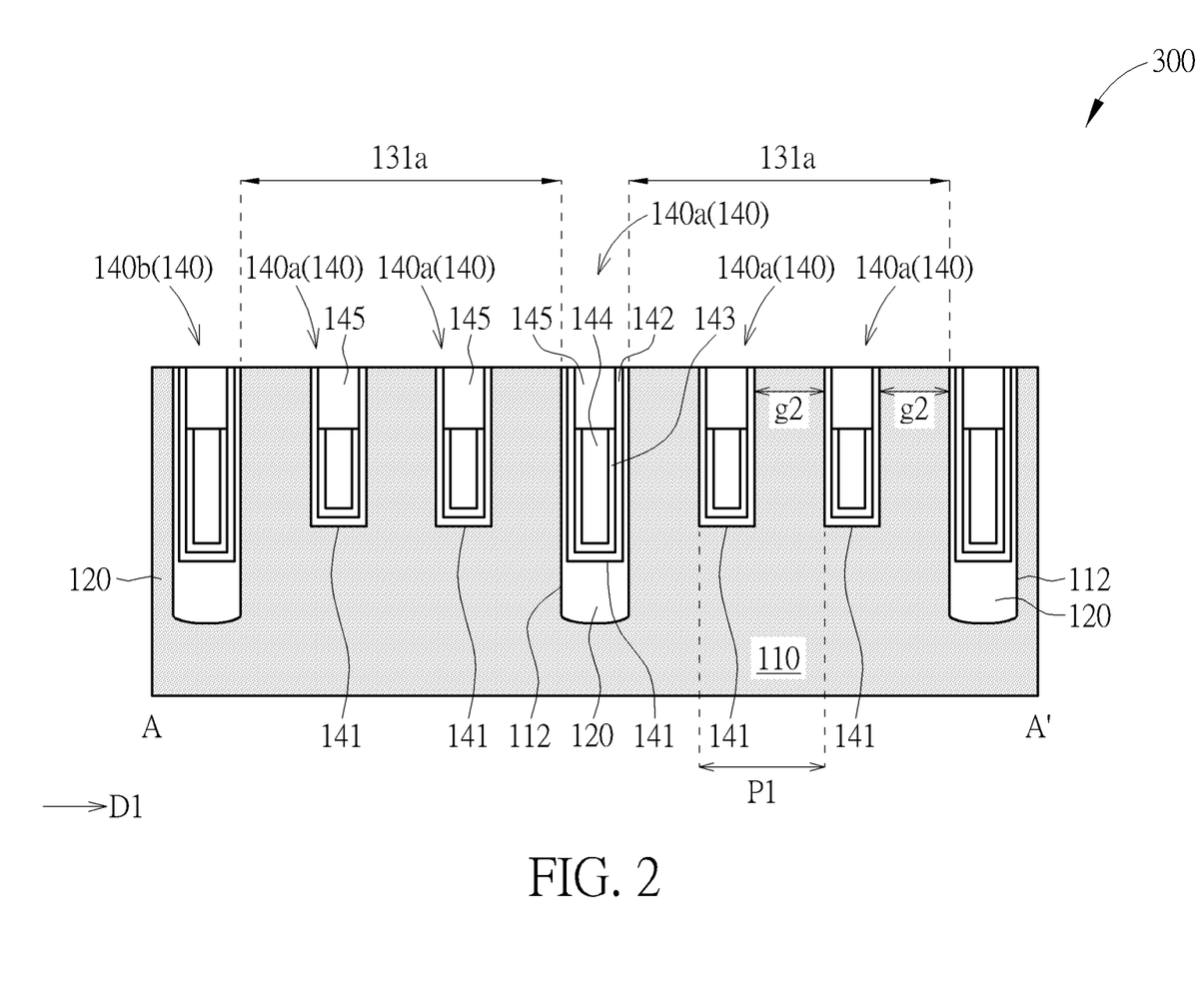
FIG. 2 is a schematic cross-sectional view taken along a cross-line A-A' in FIG. 1.

Please refer to FIGS. 1-2, which illustrate schematic diagrams of a semiconductor memory device 300 according to the preferable embodiment in the present disclosure, with FIG. 1, and FIG. 2 respectively illustrating a top view and a cross-sectional view of the semiconductor memory device 300. The semiconductor memory device 300 includes a substrate 110, for example a silicon substrate, a silicon containing substrate (such as SiC or SiGe), or a silicon-on-insulator (SOI) substrate, which includes at least one shallow trench isolation (STI) 120 disposed therein to define an active structure 130 in the substrate 110. That is, the shallow trench isolation 120 is disposed around the active structure 130. The active structure 130 further includes a first active area 131 disposed within a region (for example a memory cell region being highly integrity in the semiconductor memory device 300), and a second active area 133 disposed within another region (for example a periphery region being lower integrity in the semiconductor memory device 300). Preferably, the another region (for example the periphery region) is disposed outside the periphery of the region (for example the memory cell region), so that, the second active area 133 may be disposed around the periphery of the first active area 131, as shown in FIG. 1, but not limited thereto.

Please referring to FIG. 1 and FIG. 2, the first active area 131 further includes a plurality active fragments 131*a* and a plurality of active fragments 131*b* parallel and separately extended along a first direction D1 to alternately arrange with each other in the first direction D1, wherein the first direction D1 is for example crossed and not perpendicular to the y-direction (such as a second direction D2) or the x-direction (such as a third direction D3). Precisely speaking, each of the first active fragments 131*a* for example includes the same length L1 in the first direction D1, and each of the second active fragments 131*b* includes a different length for example being the lengths L2, L3, L4, L5 all different from length L1 in the first direction D1. It is noted that any two adjacent ones of the second active fragments 131*b* in the second direction D2 or in the third direction D3 may optionally include different lengths, for example being the length L2 and the length L3 both greater than the length L1, or being the length L3 and the length L4 greater or less than the length L1 respectively, or being the length L4 and the length L5 both less than the length L1, as shown in FIG. 1, but is not limited thereto.

It is also noted that the adjacent ones of the first active fragments 131*a* and/or the adjacent ones of the second active fragments 131*b* have the same gaps g1, g2 respectively in the second direction D2 and in the first direction D1, the gaps g2 in the first direction D1 is greater than the gaps g1 in the second direction D2, as shown in FIG. 1. Then, the first active fragments 131*a* may be sequentially arranged along the first direction D1 by the same gaps g2, and the second active fragments 131*b* may also be sequentially arranged outside the periphery of all of the first active fragments 131*a* by the same gaps g2, for example being arranged at the left side, the bottom side, the right side and the top side (not shown in the drawings) of all of the first active fragments 131*a*, thereby presenting a particular arrangement, such as an array arrangement as shown in FIG. 1, but not limited thereto.

In one embodiment, the formation of the first active area 131 is but not limited to be accomplished through the following patterning process. For example, a mask layer (not shown in the drawings) may be firstly formed on the substrate 110, with the mask layer including plural patterns for defining the first active fragments 131*a* and the second active fragments 131*b* and with a portion of the substrate 110 being exposed form the mask layer, an etching process is then performed by using the mask layer, to remove the portion of the substrate 110 and to form at least one shallow trench 112, and an insulating material (not shown in the drawings) for example including silicon oxide ($SiO_x$), silicon nitride (SiN) or silicon oxiynitride (SiON) is formed to fill in the shallow trench 112, to form the shallow trench isolation 120 with coplanar surface with the top surface of the substrate 110, and to simultaneously define the first active fragments 131*a* and the second active fragments 131*b* in the substrate 110, as shown in FIG. 1 and FIG. 2. In another embodiment, the formation of the first active area 131 may also be accomplished by a self-aligned double patterning (SADP) process or a self-aligned reverse patterning (SARP) process, but not limited thereto.

Please further in view of FIG. 1, the second active area 133 is disposed around the periphery of the first active area 131. In the present embodiment, the second active area 133 further includes at least two first edges 133*a* extended along the second direction D2, and at least one second edge 133*b* extended along the third direction D3. The first edges 133*a* are opposite to each other and are adjacent to the second edge 133*b* to arrange in sequence, such that, the whole second active area 133 may perform like a rectangular frame (not shown in the drawings) to directly in contact with all of the second active fragments 131*b*. In other words, while the second active area 133 is formed, the second active fragments 131*b* may further connect to the first edges 133*a* and/or the second edge 133*b* of the second active area 133 directly, and a part of the second active fragments 131*b* may simultaneously contact the first edges 133*a* and the second edge 133*b*, as shown in FIG. 1. On the other hand, the first active fragments 131*a* are not connected to the first edges 133*a* and/or the second edge 133*b* of the second active area 133 at all, and which is spaced apart from the first edges 133*a* and/or the second edge 133*b* of the second active area 133. Also, the first edges 133*a* and/or the second edge 133*b* of the second active area 133 may include the same width T1, and the width T1 may be preferably greater than the width W of the first active fragments 131*a* or the second active fragments 131*b*, but is not limited thereto. With these arrangements, the second active area 133 may be allowable to uniformly disperse the stresses suffered from the second active fragments 131*b* and the shallow trench isolation 120, and the stresses suffered from the second active fragments 131*b* may be uniformly distributed to the periphery through the different lengths L2, L3, L4, L5 of the second active fragments 131*b*, thereby obtaining a further reliable structure. However, in another embodiments (not shown in the drawings), the second active area 133 may also not contact any second active fragments 131*b* at all optionally, or the width T1 of the second edge 133*b* and the first edges 133*a* may also be the same or smaller than the width W of the first active fragments 131*a* or the second active fragments 131*b*, based on practical product requirements. People in the art should fully realize that the practical disposing number of the first edges or the second edge may be further adjustable due to practical product requirements, or the second active area is not limited to be the aforementioned rectangular frame, for example, further edges may be additionally disposed to make the second active area to perform like various shapes.

It is noted that, in the present embodiment, the formation of the second active area 133 may also be accomplished through the patterning process of the substrate 110, and which may optionally be carried out together with the patterning process of the first active area 131. That is, in the present embodiment, the same or different mask layer(s) may be used to either simultaneously define or separately define the patterns of the first active area 131 and the second active area 133, followed by etching the substrate 110, and filling in the insulating material. Then, the first active area 131 and the second active area 133 may include the same material, namely the material of the substrate 110, and also, the first edges 133a and the second edge 133b of the second active area 133, and the second active fragments 131b, which are connected with the first edges 133a and the second edge 133b may be monolithic, as shown in FIG. 1. In this situation, the second active fragments 131b of the first active area 131 which are connected to the first edges 133a or the second edge 133b of the second active area 133 may be serve as an inward extension of the first edges 133a and the second edge 133b, to uniformly disperse the stresses suffered from the second active area 133 to the periphery through the different lengths L2, L3, L4, L5 of the second active fragments 131b, so that, the second active area 133 may obtain a relative stable, strengthened structure to protect the first active fragments 131a disposed at the inner side thereof. Then, the possible structural collapse or damage of the first active fragments 131a may be successfully avoided. However, people in the art should fully realize that the formation of the second active area is not limited to be accomplished through the aforementioned process, and may also be formed through other processes, for example being carried out separately from the formation of the first active area. As an example, in one embodiment, the fabricating process of the second active area may be performed before the fabricating process of the first active area, in which, the second active area may be formed firstly through the patterning process of the substrate, and the first active area is then formed by performing an epitaxial growth process (not shown in the drawings). Accordingly, the topmost surfaces of the second active area and first active area may not be leveled with each other. Otherwise, in another embodiment, the fabricating process of the second active area may also be performed after the fabricating process of the first active area, in which, the first active area is firstly formed through the patterning process of the substrate, and the second active area is then formed through a deposition process. Accordingly, the second active area and the first active area may include different materials, for example, the second active area may include polysilicon or a dielectric material which is different from that of the substrate.

Next, as shown in FIG. 1 and FIG. 2, a plurality of gate structure, preferably a plurality of buried gate structures 140, is formed in the substrate 110. In the present embodiment, a plurality of trenches 141 which is parallel with each other and extends along the second direction D2 is firstly formed in the substrate 110. Then, an interface dielectric layer 142 entirely covering surfaces of each of the trenches 141, a gate dielectric layer 143 covering bottom surfaces of each of the trenches 141, a gate electrode layer 144 filling up the bottom of each of the trenches 141, and a mask layer 145 filling up the top of each of the trenches 141, are sequentially formed in the trenches 141. Accordingly, the topmost surface of the mask layer 145 may be coplanar with the top surface of the substrate 110, as shown in FIG. 2, so that, each of the buried gate structures 140 embedded in the substrate 110 may therefore function like a word line (WL) of the semiconductor memory device 300, wherein each word line (namely the buried gate structure 140) is parallel with the first edges 133a of the second active area 133 to sequentially arrange along the third direction D3 by the same pitch P1. Precisely speaking, the word lines include a plurality of first word lines 140a and a plurality of second word lines 140b, wherein the first word lines 140a are extended along the second direction D2 to intersect with the second active fragments 131b, the first active fragments 131a sequentially, for receiving or transmitting voltage signals from each memory cell (not shown in the drawings). The second word lines 140b are also extended along the second direction D2, and disposed at two opposite sides of all of the first word lines 140a in the third direction D3, as shown in FIG. 1. It is noted that the second word lines 140b only intersect with the second active fragments 131b, so as to serve as dummy word lines. That is, the possible directly connection between the first word lines 140a disposed at the inner side and the bit lines (not shown in the drawings) formed subsequently may be successfully avoided through the first active area 131. Furthermore, it is also noted that the first word lines 140a and a part of the second word lines 140b may simultaneously pass through the first portions and the second portions of the shallow trench isolation 120 which are filled in the gaps g1, g2, respectively, and at least one of the second word lines 140b only passes through the first portions of the shallow trench isolation 120 which are filled in the gaps g1, without passing through the second portions of the shallow trench isolation 120 which are filled in the gaps g2, as shown in FIG. 1.

People in the art should fully understand that the practical number of the second word lines 140b (namely the dummy word lines) may be diverse by the practical requirements. In the present embodiment, two word lines 140b are respectively disposed at two sides of the first word lines 140a, but are not limited thereto. In another embodiment, more than two dummy word lines may be optionally disposed to further isolate the first word lines 140a disposed at the inner side. The dummy word lines (the second word lines 140b) and the first word lines 140a have the same pitch P1 and the width, and which may be formed simultaneously through the same photolithography process. In this way, the integration of all of the word lines may be maintain at a particular value under a simplified fabricating process, and the fabricating process of the first word lines 140a may be prevented from being affected by the dummy word lines.

Through the aforementioned arrangements, the semiconductor memory device 300 accordingly to the preferred embodiment is completed. The semiconductor memory device 300 includes the second active fragments 131b with different lengths and directly connected to the second active area 133, which may uniformly disperse the stress suffered from the second active area 133 to the periphery, so that the second active area 133 may therefore obtain a relatively stable and strengthened structure, to protect the first active fragments 131a disposed at the inner side and to avoid structural collapse or damage. Furthermore, the semiconductor memory device 300 further includes the first word lines 140a disposed at the inner side and the second word lines 140b (namely, the dummy word lines) disposed at the outer side, wherein at least one of the second word lines 140b only passes through the first portions of the shallow trench isolation 120 filled in the gaps g1, without passing through any second portions of the shallow trench isolation 120, or at least two of the second word lines 140b only pass through the second active fragments 131b. Through these, the aforementioned arrangement of the second word lines 140b (namely, the dummy word lines) is allowable to be used on protecting the first word lines 140a disposed at the inner side, to prevent the first word lines 140a disposed at the inner side from being directly conducted with the bit lines formed subsequently through the first active area 131. Based on these arrangements, the semiconductor memory device 300 of the present disclosure may gain better functions and performances thereby.

However, people in the art should fully realize that the semiconductor memory device and the fabricating method thereof are not be limited to aforementioned embodiment and may include other examples or may be achieved through other strategies to meet practical product requirements. For example, in one embodiment, the etching conditions may be further adjusted during the patterning process of the second active area to form the second active area with rounding corners, but not limited thereto. The following description will detail the different embodiments of the semiconductor device and the fabricating method thereof. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
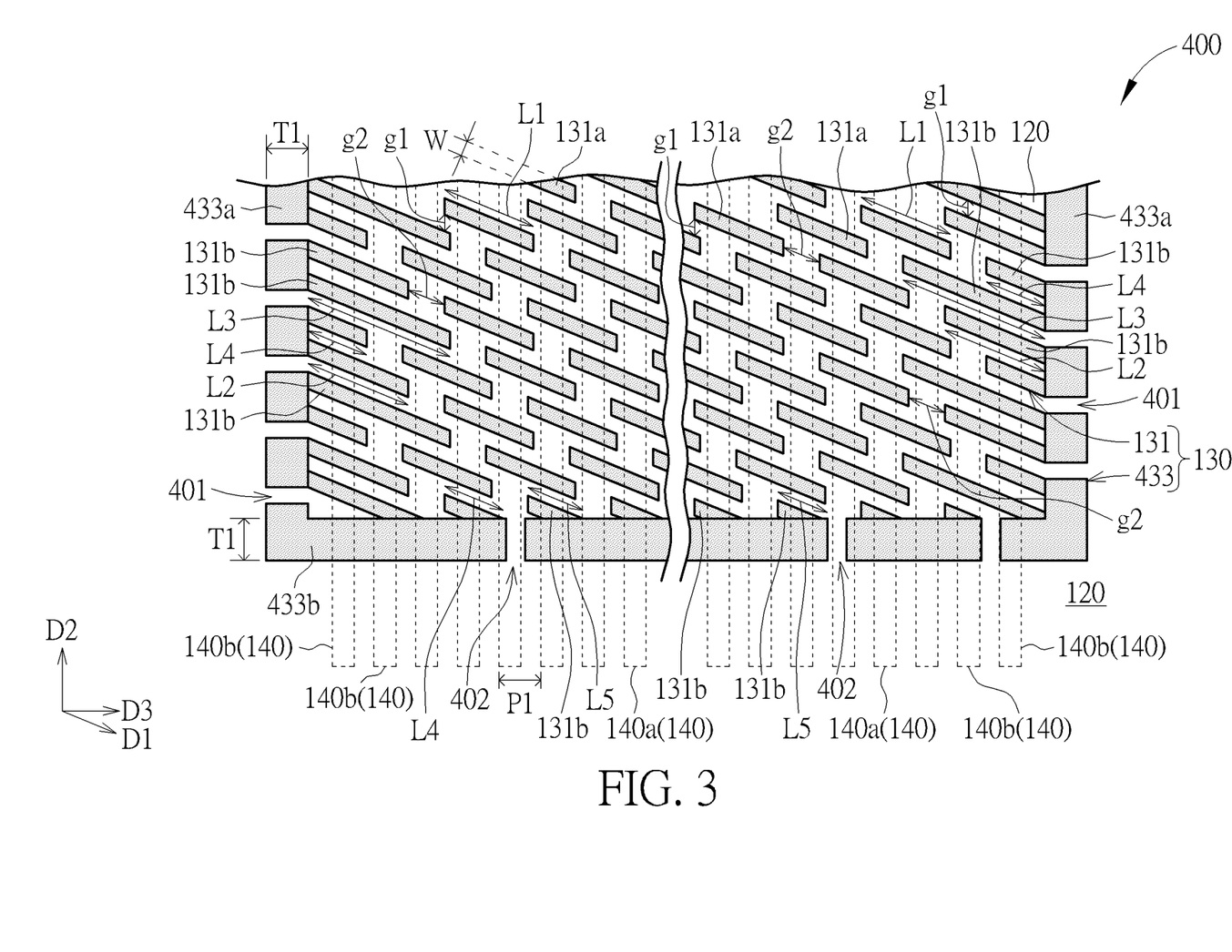
FIG. 3 is a schematic diagram illustrating a semiconductor memory device according to a second preferable embodiment in the present disclosure.

Please refer to FIG. 3, which illustrate schematic diagrams of a semiconductor memory device 400 according to the second preferable embodiment in the present disclosure. In the present embodiment, the structure of the semiconductor memory device 400 is substantially the same as those of the aforementioned first preferable embodiment, including the substrate 110, the active structure 130 (including the first active area 131 and the second active area 433), the shallow trench isolation 120, and the word lines (for example including the first word lines 140a and the second word lines 140b), and which may not be redundantly described hereinafter. The difference between the semiconductor memory device 400 and the aforementioned semiconductor memory device 300 is in that a plurality of openings 401, 402 is further disposed on the second active area 433, and the first edges 433a and the second edge 433b of the second active area 433 may be respectively cut into a plurality of segments (not shown in the drawings).

Precisely speaking, the segments of the first edges 433a are spaced apart by the openings 401, and which may directly contact to two adjacent ones of the second active fragments 131b in the second direction D2. Likewise, the segments of the second edge 433b are spaced apart by the openings 402, and which may directly contact to two adjacent ones of the second active fragments 131b in the third direction D3. In other words, any two adjacent ones of the second active fragments 131b may be connected to each other through the first edges 433a or the second edge 433b, and each two adjacent ones of the second active fragments 131b are separated from others. Also, the second active fragments 131b connected to the same segment may have different lengths in the first direction D1, for example being the length L2 and the length L3 respectively, which are both greater than the length L1, or being the length L4 and the length L5 respectively, which are both less than the length L1, as shown in FIG. 3, but not limited thereto.

Through the aforementioned arrangements, the semiconductor memory device 400 accordingly to the preferred second also includes the second active fragments 131b with different lengths and directly connected to the second active area 433, which may uniformly disperse the stress suffered from the second active area 433 to the periphery. Meanwhile, the second active area 433 of the present embodiment further includes the openings 401, 402 disposed thereon, which may further disperse the stresses suffered from each edge (including the first edges 433a and the second edge 433b) of the second active area 433, so that, the second active area 433 may therefore obtain a relatively stable and strengthened structure, to protect the first active fragments 131a disposed at the inner side and to avoid structural collapse or damage. Based on these arrangements, the semiconductor memory device 400 of the present disclosure may gain better functions and performances thereby.

Figure 4:
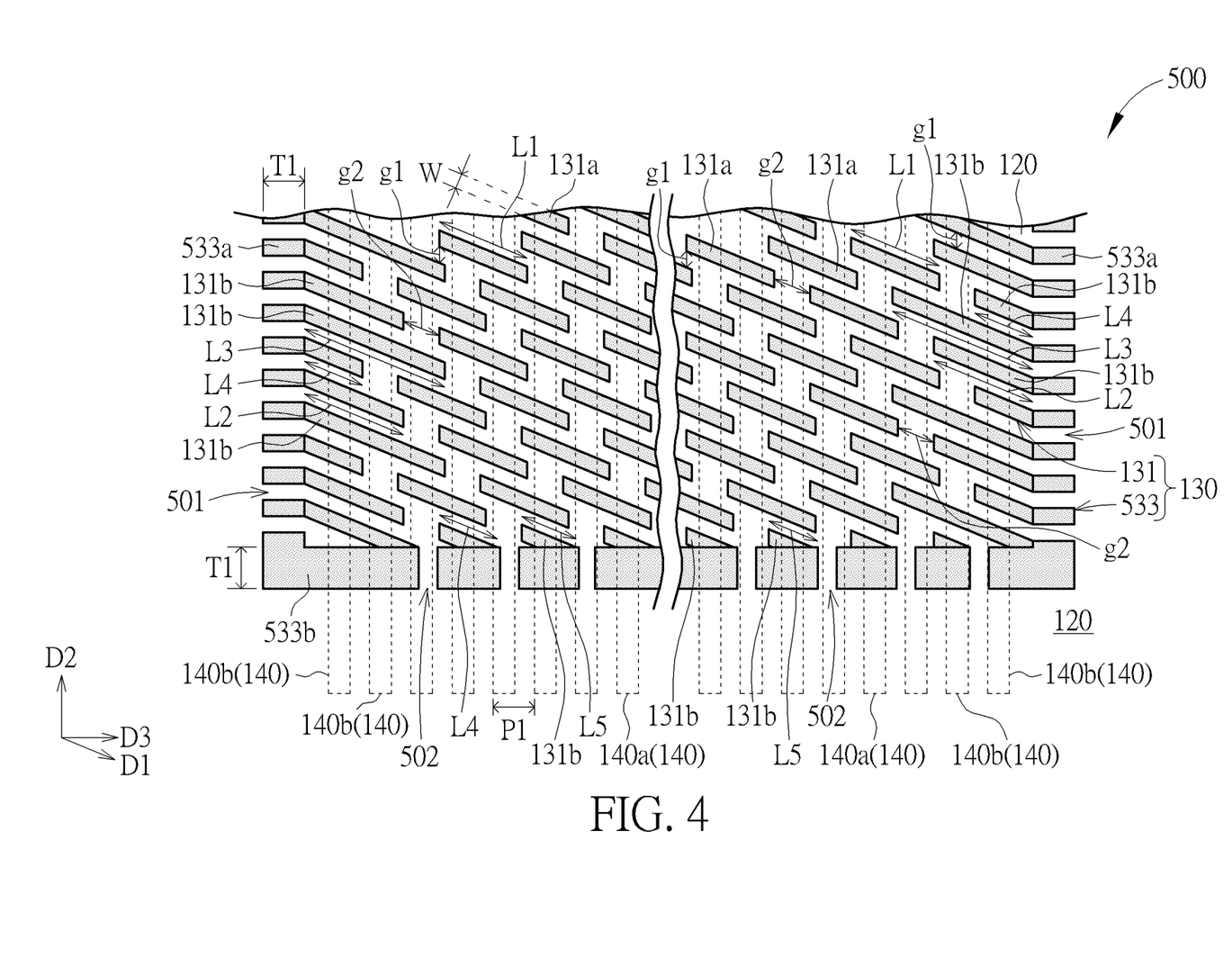
FIG. 4 is a schematic diagram illustrating a semiconductor memory device according to a third preferable embodiment in the present disclosure.

Please refer to FIG. 4, which illustrate schematic diagrams of a semiconductor memory device 500 according to the third preferable embodiment in the present disclosure. In the present embodiment, the structure of the semiconductor memory device 500 is substantially the same as those of the aforementioned first preferable embodiment, including the substrate 110, the active structure 130 (including the first active area 131 and the second active area 533), the shallow trench isolation 120, and the word lines (for example including the first word lines 140a and the second word lines 140b), and which may not be redundantly described hereinafter. The difference between the semiconductor memory device 500 and the aforementioned semiconductor memory device 300 is in that a plurality of openings 501, 502 is further disposed on the second active area 533, and the first edges 533a and the second edge 533b of the second active area 533 may be respectively cut into a plurality of segments (not shown in the drawings).

Precisely speaking, the segments of the first edges 533a are spaced apart by the openings 501, and which may directly contact to each one of the second active fragments 131b in the second direction D2. Likewise, the segments of the second edge 533b are spaced apart by the openings 502, and which may directly contact to each one of the second active fragments 131b in the third direction D3. In other words, any two adjacent ones of the second active fragments 131b may be separated from each other, and each one of the second active fragments 131b may be connected to the segments of the first edges 533a or the second edge 533b, as shown in FIG. 4.

Through the aforementioned arrangements, the semiconductor memory device 500 accordingly to the preferred third also includes the second active fragments 131b with different lengths and directly connected to the second active area 533, which may uniformly disperse the stress suffered from the second active area 533 to the periphery. Meanwhile, the second active area 533 of the present embodiment further includes the openings 501, 502 disposed thereon, which may further disperse the stresses suffered from each edge (including the first edges 533a and the second edge 533b) of the second active area 533, so that, the second active area 533 may therefore obtain a relatively stable and strengthened structure, to protect the first active fragments 131a disposed at the inner side and to avoid structural collapse or damage. Based on these arrangements, the semiconductor memory device 500 of the present disclosure may gain better functions and performances thereby.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising;
   a substrate;
   an active structure disposed in the substrate, the active structure comprising a plurality of first active fragments and a plurality of second active fragments, each of the plurality of first active fragments and each of the plurality of second active fragments extending parallel to each other along a first direction, the plurality of second active fragments being disposed outside a periphery of all of the plurality of first active fragments, wherein a length of each of the plurality of first active fragments in the first direction is different from a length of each of the plurality of second active fragments in the first direction;
a shallow trench isolation, disposed in the substrate to surround the active structure; and
a plurality of word lines, disposed in the substrate, the plurality of word lines being parallel with each other to extend along a second direction, at least one of the plurality of word lines being only intersected with the plurality of second active fragments, and the second direction being not perpendicular to the first direction.

2. The semiconductor memory device according to claim 1, wherein each of the plurality of first active fragments comprises a first length in the first direction, each of the plurality of second active fragments comprises a length greater or less than the first length.

3. The semiconductor memory device according to claim 1, wherein the plurality of first active fragments and the plurality of second active fragments comprise first gaps therebetween in the second direction, and the plurality of first active fragments and the plurality of second active fragments comprise second gaps therebetween in the first direction, the second gap is greater than the first gap, and the shallow trench isolation comprises a plurality of first portions and a plurality of second portions filled in the first gaps and the second gaps respectively.

4. The semiconductor memory device according to claim 3, wherein the at least one of the plurality of word lines does not intersect with any one of the second portions.

5. The semiconductor memory device according to claim 4, wherein others of the plurality of word lines intersect with the plurality of first portions and the plurality of second portions sequentially.

6. The semiconductor memory device according to claim 1, wherein the active structure comprises an active area surrounded the plurality of first active fragments and the plurality of second active fragments, and all of the plurality of second active fragments directly contact the active area.

7. The semiconductor memory device according to claim 6, wherein the active area comprises a plurality of segments, and each of the plurality of second active fragments directly contacts each of the plurality of segments.

8. The semiconductor memory device according to claim 6, wherein the active area comprises a plurality of segments, and any two adjacent ones of the plurality of second active fragments directly contact each of the plurality of segments.

9. A semiconductor memory device, comprising;
a substrate;
an active structure disposed in the substrate, the active structure comprising a plurality of first active fragments and a plurality of second active fragments, each of the plurality of first active fragments and each of the plurality of second active fragments extending parallel to each other along a first direction, the plurality of second active fragments being disposed outside a periphery of all of the plurality of first active fragments, wherein a length of each of the plurality of first active fragments in the first direction is different from a length of each of the plurality of second active fragments in the first direction;
a shallow trench isolation, disposed in the substrate to surround the active structure; and
a plurality of word lines, disposed in the substrate, the plurality of word lines being parallel with each other to extend along a second direction, one of the plurality of word lines being intersected with at least three of the plurality of second active fragments which are arranged continuously in a sequence.

10. The semiconductor memory device according to claim 9, wherein each of the plurality of first active fragments comprises a first length in the first direction, each of the plurality of second active fragments comprises a length greater or less than the first length.

11. The semiconductor memory device according to claim 9, wherein the plurality of first active fragments and the plurality of second active fragments comprise first gaps therebetween in the second direction, and the plurality of first active fragments and the plurality of second active fragments comprise second gaps therebetween in the first direction, the second gap is greater than the first gap, and the shallow trench isolation comprises a plurality of first portions and a plurality of second portions filled in the first gaps and the second gaps respectively.

12. The semiconductor memory device according to claim 11, wherein the at least one of the plurality of word lines does not intersect with any one of the second portions.

13. The semiconductor memory device according to claim 12, wherein others of the plurality of word lines intersect with the plurality of first portions and the plurality of second portions sequentially.

14. The semiconductor memory device according to claim 9, wherein the active structure comprises an active area surrounded the plurality of first active fragments and the plurality of second active fragments, and all of the plurality of second active fragments directly contact the active area.

15. The semiconductor memory device according to claim 14, wherein the active area comprises a plurality of segments, and each of the plurality of second active fragments directly contacts each of the plurality of segments.

16. The semiconductor memory device according to claim 14, wherein the active area comprises a plurality of segments, and any two adjacent ones of the plurality of second active fragments directly contact each of the plurality of segments.

17. A semiconductor memory device, comprising;
a substrate;
an active structure disposed in the substrate, the active structure comprising a plurality of first active fragments and a plurality of second active fragments, each of the plurality of first active fragments and each of the plurality of second active fragments extending parallel to each other along a first direction, the plurality of second active fragments being disposed outside a periphery of all of the plurality of first active fragments, wherein a length of each of the plurality of first active fragments in the first direction is different from a length of each of the plurality of second active fragments in the first direction;
a shallow trench isolation, disposed in the substrate to surround the active structure; and
a plurality of word lines, disposed in the substrate, the plurality of word lines being parallel with each other to extend along a second direction, wherein a distance between two ends of one of the plurality of second active fragments in a third direction is greater than a minimum distance from the one of the plurality of second active fragments to a closed one of the plurality of word lines.

18. The semiconductor memory device according to claim 17, wherein the plurality of first active fragments and the plurality of second active fragments comprise first gaps therebetween in the second direction, and the plurality of first active fragments and the plurality of second active fragments comprise second gaps therebetween in the first direction, the second gap is greater than the first gap, and the shallow trench isolation comprises a plurality of first portions and a plurality of second portions filled in the first gaps and the second gaps respectively.

19. The semiconductor memory device according to claim 18, wherein the closed one of the plurality of word lines does not intersect with any one of the second portions and others of the plurality of word lines intersect with the plurality of first portions and the plurality of second portions sequentially.

20. The semiconductor memory device according to claim 17, wherein the active structure comprises an active area surrounded the plurality of first active fragments and the plurality of second active fragments, and all of the plurality of second active fragments directly contact the active area.

\* \* \* \* \*